US011984151B2

(12) United States Patent
Rawat et al.

(10) Patent No.: US 11,984,151 B2
(45) Date of Patent: May 14, 2024

(54) ADAPTIVE BIT LINE OVERDRIVE CONTROL FOR AN IN-MEMORY COMPUTE OPERATION WHERE SIMULTANEOUS ACCESS IS MADE TO PLURAL ROWS OF A STATIC RANDOM ACCESS MEMORY (SRAM)

(71) Applicant: STMicroelectronics International N.V., Geneva (CH)

(72) Inventors: Harsh Rawat, Haryana (IN); Kedar Janardan Dhori, Ghaziabad (IN); Promod Kumar, Greater Noida (IN); Nitin Chawla, Noida (IN); Manuj Ayodhyawasi, Noida (IN)

(73) Assignee: STMicroelectronics International N.V., Geneva (CH)

( * ) Notice: Subject to any disclaimer, the term of this patent is extended or adjusted under 35 U.S.C. 154(b) by 92 days.

(21) Appl. No.: 17/850,207

(22) Filed: Jun. 27, 2022

(65) Prior Publication Data

US 2023/0009329 A1    Jan. 12, 2023

Related U.S. Application Data

(60) Provisional application No. 63/219,897, filed on Jul. 9, 2021.

(51) Int. Cl.
*G11C 11/10* (2006.01)
*G11C 11/4074* (2006.01)
(Continued)

(52) U.S. Cl.
CPC ...... *G11C 11/4085* (2013.01); *G11C 11/4074* (2013.01); *G11C 11/4094* (2013.01); *G11C 11/4096* (2013.01)

(58) Field of Classification Search
CPC ............ G11C 11/4085; G11C 11/4074; G11C 11/4094; G11C 11/4096; G11C 8/08;
(Continued)

(56) References Cited

U.S. PATENT DOCUMENTS

| 6,198,671 B1 | 3/2001 | Aoyama et al. |
| 6,785,161 B2 | 8/2004 | Pekny |

(Continued)

FOREIGN PATENT DOCUMENTS

| CN | 110503995 A | 11/2019 |
| EP | 0461430 A1 | 12/1991 |

(Continued)

OTHER PUBLICATIONS

Luo, Shien-Chun, et al: "A Subthreshold SRAM Cell with Autonomous Bitline-Voltage Clamping," 2010 IEEE.

(Continued)

*Primary Examiner* — Xiaochun L Chen
(74) *Attorney, Agent, or Firm* — Crowe & Dunlevy LLC (57) ABSTRACT

A circuit includes a memory array with SRAM cells connected in rows by word lines and in columns by bit lines. A row controller circuit simultaneously actuates, through a word line driver circuit for each row, word lines in parallel for an in-memory compute operation. A column processing circuit processes analog voltages developed on the bit lines in response to the simultaneous actuation to generate a decision output for the in-memory compute operation. A bit line precharge circuit generates a precharge voltage for application to each pair of bit lines. The precharge voltage has a first voltage level (not greater than a positive supply voltage for the SRAM cells) when the memory array is operating in a data read/write mode. The precharge voltage has a second voltage level (greater than the first voltage (Continued)

level) in advance of the simultaneous actuation of the word lines for the in-memory compute operation.

32 Claims, 8 Drawing Sheets

(51) Int. Cl.
  *G11C 11/408* (2006.01)
  *G11C 11/4094* (2006.01)
  *G11C 11/4096* (2006.01)
(58) Field of Classification Search
  CPC ....... G11C 7/1006; G11C 7/12; G11C 11/418; G11C 11/419; G11C 5/147; G06F 12/1009
  See application file for complete search history.

(56) References Cited

U.S. PATENT DOCUMENTS

| | | | |
|---|---|---|---|
| 7,120,061 | B2 | 10/2006 | Daga |
| 7,227,769 | B2 | 6/2007 | Fukushi et al. |
| 7,289,354 | B2 | 10/2007 | Houston |
| 7,342,845 | B2 | 3/2008 | Somasekhar et al. |
| 7,502,247 | B2 | 3/2009 | Houston |
| 7,525,834 | B2 | 4/2009 | Sohn |
| 7,564,725 | B2 | 7/2009 | Houston |
| 7,570,527 | B2 | 8/2009 | Houston |
| 7,742,326 | B2 | 6/2010 | Houston |
| 7,760,575 | B2 | 7/2010 | Tooher et al. |
| 7,773,407 | B2 | 8/2010 | Huang et al. |
| 8,004,907 | B2 | 8/2011 | Russell et al. |
| 8,064,241 | B2 | 11/2011 | Morita et al. |
| 8,134,874 | B2 | 3/2012 | Shiu et al. |
| 8,213,257 | B2 | 7/2012 | Chuang et al. |
| 8,441,829 | B2 | 5/2013 | Huang et al. |
| 8,451,652 | B2 | 5/2013 | Seikh et al. |
| 8,559,248 | B2 | 10/2013 | Dally et al. |
| 8,947,970 | B2 | 2/2015 | Pelley et al. |
| 8,966,329 | B2 | 2/2015 | Clark et al. |
| 8,971,146 | B2 | 3/2015 | Sharpe-Geisler et al. |
| 9,001,579 | B2 | 4/2015 | Song et al. |
| 9,013,949 | B2 | 4/2015 | Schreiber et al. |
| 9,087,566 | B2 | 7/2015 | Song et al. |
| 9,142,284 | B2 | 9/2015 | Lee et al. |
| 9,147,451 | B2 | 9/2015 | Chong et al. |
| 9,263,121 | B2 | 2/2016 | Karl et al. |
| 9,286,952 | B2 | 3/2016 | McLaury |
| 9,336,865 | B1 | 5/2016 | Chu et al. |
| 9,455,023 | B1 | 9/2016 | Xu et al. |
| 9,799,393 | B1 | 10/2017 | Ramamurthy et al. |
| 9,831,852 | B2 | 11/2017 | Boakye et al. |
| 9,928,898 | B2 | 3/2018 | Sahu et al. |
| 9,953,699 | B2 | 4/2018 | Ichihashi |
| 9,953,986 | B2 | 4/2018 | Wang |
| 9,997,236 | B1 | 6/2018 | Pathak |
| 10,319,434 | B2 | 6/2019 | Jung et al. |
| 10,403,629 | B2 | 9/2019 | Mann et al. |
| 10,541,013 | B1 | 1/2020 | Schreiber et al. |
| 10,559,573 | B2 | 2/2020 | Wang et al. |
| 10,650,909 | B2 | 5/2020 | Chen et al. |
| 10,679,694 | B2 | 6/2020 | Kumar et al. |
| 10,685,703 | B2 | 6/2020 | Singh et al. |
| 10,748,911 | B2 | 8/2020 | Singh et al. |
| 10,796,732 | B2 | 10/2020 | Yoshihara et al. |
| 10,811,088 | B2 | 10/2020 | Raj et al. |
| 11,048,434 | B2 * | 6/2021 | Kumar .................. G11C 11/419 |
| 2006/0044018 | A1 | 3/2006 | Chang |
| 2009/0046519 | A1 | 2/2009 | Wang et al. |
| 2011/0261633 | A1 | 10/2011 | Chandra et al. |
| 2014/0185364 | A1 | 7/2014 | Iyer et al. |
| 2014/0204657 | A1 | 7/2014 | Dally |
| 2015/0179232 | A1 | 6/2015 | Felix et al. |
| 2016/0232951 | A1 | 8/2016 | Shanbhag et al. |
| 2018/0012648 | A1 | 1/2018 | Ichihashi |
| 2019/0042160 | A1 | 2/2019 | Kumar et al. |
| 2019/0042199 | A1 | 2/2019 | Sumbul et al. |
| 2020/0075090 | A1 | 3/2020 | Kumar et al. |
| 2021/0035614 | A1 | 2/2021 | Schreiber |

FOREIGN PATENT DOCUMENTS

| | | |
|---|---|---|
| EP | 3437098 B1 | 7/2019 |
| KR | 1020200091697 A | 7/2020 |
| WO | 0051131 A1 | 8/2000 |

OTHER PUBLICATIONS

Lorenzo, Rohit, et al: "A novel 9T SRAM architecture for low leakage and high performance," Analog Integrated Circuits and Signal Processing, 92, 315-325 (2017).
Kushwah, C.B., et al: "Single-Ended Boost-Less (SE-BL) 7T Process Tolerant SRAM Design in Sub-threshold Regime for Ultra-Low-Power Applications," Springer Link, Jun. 3, 2015.
Lin, Zhiting, et al.: "Cascade Current Mirror to Improve Linearity and Consistency in SRAM In-Memory Computing," IEEE Journal of Solid-State Circuits, vol. 56, No. 8, Aug. 2021, 13 pgs.
Zhang, Jintao, et al.: "In-Memory Computation of a Machine-Learning Classifier in a Standard 6T SRAM Array," IEEE Journal of Solid-State Circuits, vol. 52, No. 4, Apr. 2017, 10 pgs.
Definition of "Buffer Amplifier," Wikipedia, 2021, 6 pgs.
Chang, Chip-Hong, et al.: "Sizing of SRAM Cell with Voltage Biasing Techniques for Reliability Enhancement of Memory and PUF Functions," Journal of Low Power Electronics and Applications, 2016, 6, 16; doi:10.3390/ilpea6030016, 17 pgs.
Agrawal, Amogh, et al: X-SRAM: Enabling In-Memory Boolean Computations in CMOS Static Random Access Memories, IEEE Transactions on Circuits and Systems-I: Regular Papers, vol. 65, No. 12, Dec. 2018.
Biswas, Avishek, et al: CONF-SRAM: An Energy-Efficient SRAM With In-Memory Dot-Product Computation for Low-Power Convolution for Low-Power Convolutional Neural Networks, IEEE Journal of Solid-State Circuits, vol. 54, No. 1, Jan. 2019.
Biswas, Avishek: "Energy-Efficient Smart Embedded Memory Design for IoT and AI," Massachusetts Institute of Technology, Jun. 2018.
Dong, Qing, et al: A 351TOPS/W and 372.4GOPS Compute-in-Memory SRAM Macro in 6nm FinFET CMOS for Machine-Learning Applications, ISSCC 2020, Session 15, SRAM & Compute-In-Memory, 15.3.
H. Jia et al., 15.1 A Programmable Neural-Network Inference Accelerator Based on Scalable In-Memory Computing, 2021 IEEE International Solid-State Circuits Conference (ISSCC), 2021, pp. 236-238, doi: 10.1109/ISSCC42613.2021.9365788.
H. Jia et al., Scalable and Programmable Neural Network Inference Accelerator Based on In-Memory Computing, in IEEE Journal of Solid-State Circuits, vol. 57, No. 1, pp. 198-211, Jan. 2022, doi: 10.1109/JSSC.2021.3119018.
J.-W. Su et al., 16.3 A 28nm 384kb 6T-SRAM Computation-in-Memory Macro with 8b Precision for AI Edge Chips, 2021 IEEE International Solid-State Circuits Conference (ISSCC), 2021, pp. 250-252, doi: 10.1109/ISSCC42613.2021.9365984.
J. Lee, H. Valavi, Y. Tang and N. Verma, Fully Row/Column-Parallel In-memory Computing SRAM Macro employing Capacitor-based Mixed-signal Computation with 5-b Inputs, 2021 Symposium on VLSI Circuits, 2021, pp. 1-2, doi: 10.23919/VLSICircuits52068.2021.9492444.
Jia, Hongyang, et al: A Microprocessor Implemented in 65nm CMOS with Configurable and Bit-scalable Accelerator for Programmable In-memory Computing, IEEE Journal of Solid-State Circuits, vol. 55, No. 9, pp. 2609-2621, Sep. 2020.
Jia, Hongyang, et al: A Programmable Heterogeneous Microprocessor Based on Bit-Scalable In-Memory Computing, IEEE Journal of Solid-State Circuits, vol. 55, No. 9, Sep. 2020.
Jiang, Zhewei, et al: C3SRAM: An In-Memory-Computing SRAM Macro Based on Robust Capacitive Coupling Computing Mechanism, IEEE Journal of Solid-State Circuits, vol. 55, No. 7, Jul. 2020.
Kang, Mingu, et al: A Multi-Functional In-Memory Inference (56) References Cited

OTHER PUBLICATIONS

Processor Using a Standard 6T SRAM Array, IEEE Journal of Solid-State Circuits, vol. 53, No. 2, Feb. 2018.

Kim, Jinseok, et al: Area-Efficient and Variation-Tolerant In-Memory BNN Computing using 6T SRAM Array, 2019 Symposium on VLSI Circuits Digest of Technical Papers.

Si, Xin, et al: A 28nm 64Kb 6T SRAM Computing-in-Memory Macro with 8b MAC Operation for AI Edge Chips, ISSCC 2020, Session 15, SRAM & Compute-In-Memorya, 15.5.

Si, Xin, et al: A Twin-8T SRAM Computation-In-Memory Macro for Multipe-Bit CNN-Based Machine Learning, ISSCC 2019, Session 24, SRAM & Computation-In-Memory, 24.5.

Singh, Jawar, et al: "A 2-Port 6T SRAM Bitcell Design with Multi-Port Capabilities at Reduced Area Overhead," 2010 IEEE.

Su, Jian-Wei, et al: A 28nm 64Kb Inference-Taining Two-Way Transpose Multibit 6T SRAM Compute-in-Memory Macro for AI Edge Chips, ISSCC 2020, Session 15, SRAM & Compute-In-Memory, 15.2.

V. K. Rajanna, S. Taneja and M. Alioto, SRAM with In-Memory Inference and 90% Bitline Activity Reduction for Always-On Sensing with 109 TOPS/mm2 and 749-1,459 TOPS/W in 28nm, ESSDERC 2021—IEEE 51st European Solid-State Device Research Conference (ESSDERC), 2021, pp. 127-130, doi: 10.1109/ESSDERC53440.2021.9631782.

Valavi, Hossein, et al: A 64-Tile 2.4-Mb In-Memory-Computing CNN Accelerator Employing Charge-Domain Compute, IEEE Journal of Solid-State Circuits, vol. 54, No. 6, Jun. 2019.

Y.-D. Chih et al., 16.4 An 89TOPS/W and 16.3TOPS/mm2 All-Digital SRAM-Based Full-Precision Compute-In Memory Macro in 22nm for Machine-Learning Edge Applications, 2021 IEEE International Solid-State Circuits Conference (ISSCC), 2021, pp. 252-254, doi: 10.1109/ISSCC42613.2021.9365766.

Yin, Shihui, et al: XNOR-SRAM: In-Memory Computing SRAM Macro for Binary/Ternary Deep Neural Networks, IEEE Journal of So.id-State Circuits, vol. 55, No. 6, Jun. 2020.

Z. Chen, X. Chen and J. Gu, 15.3 A 65nm 3T Dynamic Analog RAM-Based Computing-in-Memory Macro and CNN Accelerator with Retention Enhancement, Adaptive Analog Sparsity and 44TOPS/W System Energy Efficiency, 2021 IEEE International Solid-State Circuits Conference (ISSCC), 2021, pp. 240-242, doi: 10.1109/ISSCC42613.2021.9366045.

Zhang, Jintao, et al: In-Memory Computation of a Machine-Learning Classifier in a Standard 6T SRAM Array, IEEE Journal of Solid-State Circuits, vol. 52, No. 4, Apr. 2017.

\* cited by examiner

ADAPTIVE BIT LINE OVERDRIVE CONTROL FOR AN IN-MEMORY COMPUTE OPERATION WHERE SIMULTANEOUS ACCESS IS MADE TO PLURAL ROWS OF A STATIC RANDOM ACCESS MEMORY (SRAM)

CROSS REFERENCE TO RELATED APPLICATIONS

This application claims priority from United States Provisional Application for Patent No. 63/219,897, filed Jul. 9, 2021, the disclosure of which is incorporated herein by reference.

TECHNICAL FIELD

Embodiments herein relate to an in-memory computation circuit utilizing a static random access memory (SRAM) array and, in particular, to exercising adaptive bit line overdrive control during a simultaneous access of multiple rows of the SRAM array for an in-memory compute operation.

BACKGROUND

Figure 1:
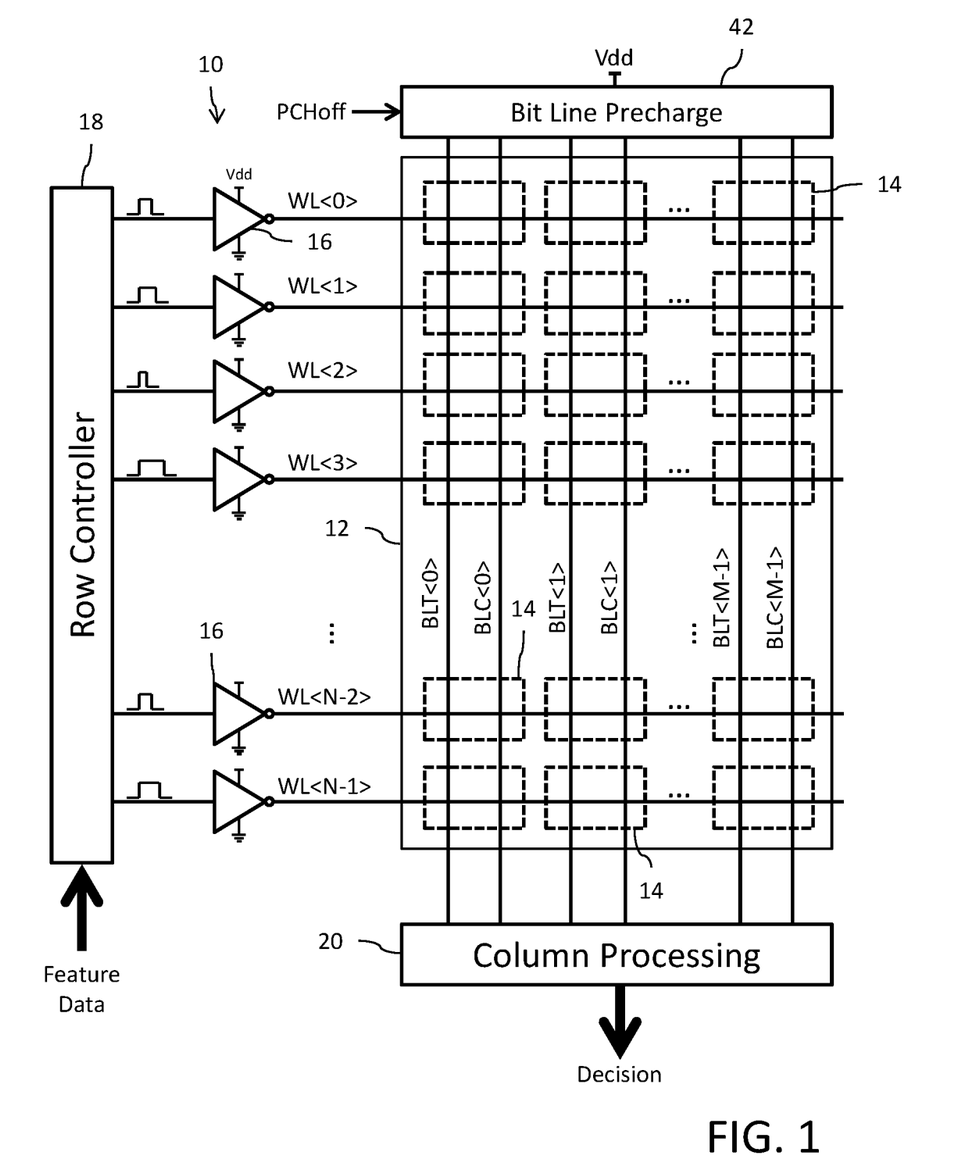
FIG. 1 is a schematic diagram of an in-memory computation circuit.

Reference is made to FIG. 1 which shows a schematic diagram of an in-memory computation circuit 10. The circuit 10 utilizes a static random access memory (SRAM) array 12 formed by standard 6T SRAM memory cells 14 arranged in a matrix format having N rows and M columns. As an alternative, a standard 8T memory cell or other SRAM cell have a similar function and topology could instead be used. Each memory cell 14 is programmed to store a bit of a computational weight for an in-memory compute operation. In this context, the in-memory compute operation is understood to be a form of a high dimensional Matrix Vector Multiplication (MVM) supporting multi-bit weights that are stored in multiple bit cells of the memory. The group of bit cells (in the case of a multibit weight) can be considered as a virtual synaptic element. Each bit of the computational weight has either a logic "1" or a logic "0" value.

Each SRAM cell 14 includes a word line WL and a pair of complementary bit lines BLT and BLC. The 8T-type SRAM cell would additionally include a read word line RWL and a read bit line RBT. The cells 14 in a common row of the matrix are connected to each other through a common word line WL (and through the common read word line RWL in the 8T-type implementation). The cells 14 in a common column of the matrix are connected to each other through a common pair of complementary bit lines BLT and BLC (and through the common read bit line RBL in the 8T-type implementation). Each word line WL, RWL is driven by a word line driver circuit 16 which may be implemented as a CMOS driver circuit (for example, a series connected p-channel and n-channel MOSFET transistor pair forming a logic inverter circuit). The word line signals applied to the word lines, and driven by the word line driver circuits 16, are generated from feature data input to the in-memory computation circuit 10 and controlled by a row controller circuit 18. A column processing circuit 20 senses the analog signal voltages on the pairs of complementary bit lines BLT and BLC (and/or on the read bit line RBL) for the M columns and generates a decision output for the in-memory compute operation from those analog signal voltages. The column processing circuit 20 can be implemented to support processing where the voltages on the columns are first processed individually and then followed by a recombination of multiple column outputs.

Although not explicitly shown in FIG. 1, it will be understood that the circuit 10 further includes conventional row decode, column decode, and read-write circuits known to those skilled in the art for use in connection with writing bits of the computational weight to, and reading bits of the computational weight from, the SRAM cells 14 of the memory array 12.

Figure 2:
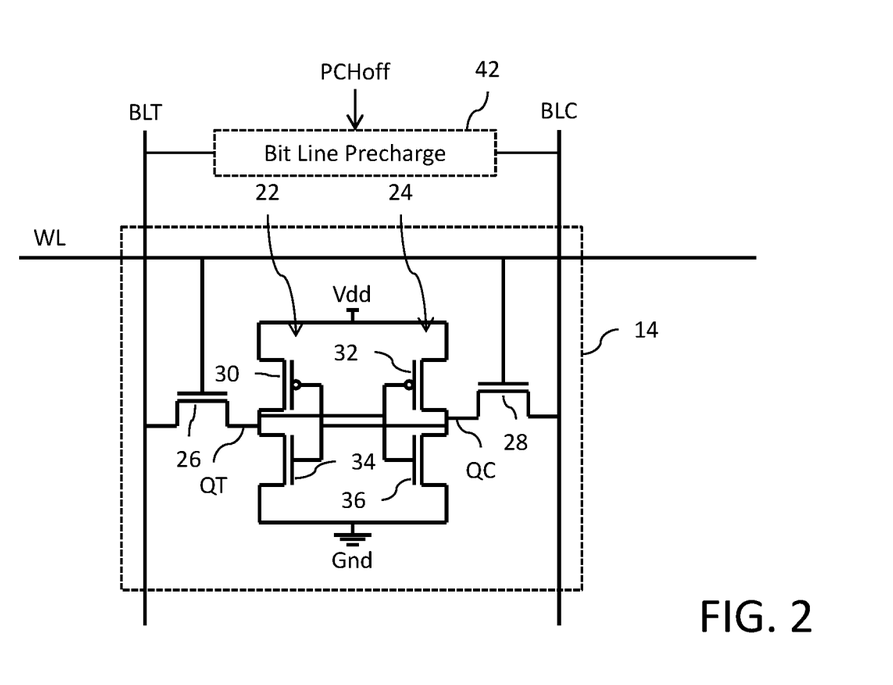
FIG. 2 is a circuit diagram of a standard 6T static random access memory (SRAM) cell as used the memory array of the in-memory computation circuit shown in FIG. 1.

With reference now to FIG. 2, each memory cell 14 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node. While FIG. 2 is specific to the use of 6T-type cells, those skilled in the art recognize that the 8T-type cell is similarly configured and would further include a signal path that is coupled to one of the storage nodes and includes a transfer (passgate) transistor coupled to the read word line RWL and gate driven by the signal on the read word line RWL. The word line driver circuit 16 is also typically coupled to receive the high supply voltage (Vdd) at the high supply node and is referenced to the low supply voltage (Gnd) at the low supply node.

The row controller circuit 18 performs the function of selecting which ones of the word lines WL<0> to WL<N−1> are to be simultaneously accessed (or actuated) in parallel during an in-memory compute operation, and further functions to control application of pulsed signals to the word lines in accordance with the feature data for that in-memory compute operation. FIG. 1 illustrates, by way of example only, the simultaneous actuation of all N word lines with the pulsed word line signals, it being understood that in-memory compute operations may instead utilize a simultaneous actuation of fewer than all rows of the SRAM array. The analog signal voltages which develop on a given pair of complementary bit lines BLT and BLC (or develop on the read bit line RBL in the 8T-type implementation) are dependent on the logic state of the bits of the computational weight stored in the memory cells 14 of the corresponding column and the width(s) of the pulsed word line signals applied to those memory cells 14.

The implementation illustrated in FIG. 1 shows an example in the form of a pulse width modulation (PWM) for the applied word line signals for the in-memory compute operation. The use of PWM or period pulse modulation (PTM) for the applied word line signals is a common technique used for the in-memory compute operation based on the linearity of the vector for the multiply-accumulation (MAC) operation. The pulsed word line signal format can be further evolved as an encoded pulse train to manage block sparsity of the feature data of the in-memory compute operation. It is accordingly recognized that an arbitrary set of encoding schemes for the applied word line signals can be used when simultaneously driving multiple word lines responsive to the feature data. Furthermore, in a simpler implementation, it will be understood that all applied word line signals in the simultaneous actuation may instead have a same pulse width.

A bit line precharge circuit 42 is connected to each pair of complementary bit lines BLT and BLC and functions in response to a precharge off control signal PCHoff to charge both bit lines in each pair to a precharge voltage level (for example, the level of the high supply voltage Vdd). The bit line precharge operation is performed prior to the simultaneous access of the word lines WL<0> to WL<N−1> during a computation cycle of the in-memory compute operation, and is also performed in connection with the normal operation to write data bits to, and read data bits from, the SRAM cells 14 of the memory array 12.

Figure 3:
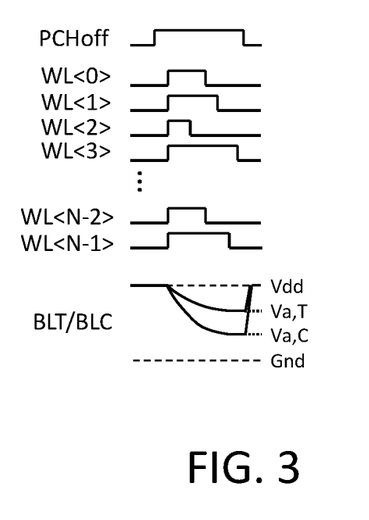
FIG. 3 is a timing diagram illustrating an in-memory compute operation for the circuit of FIG. 1.

FIG. 3 is a timing diagram showing deassertion (logic low) of the precharge off control signal PCHoff to charge the pair of complementary bit lines BLT and BLC to the Vdd voltage level, and then the assertion (logic high) of the precharge off control signal PCHoff (to deactuate precharge circuitry of the precharge circuit 42) followed by the simultaneous application of the pulse width modulated word line signals to plural rows of memory cells 14 in the SRAM array 12 in response to the feature data for a computation cycle of a given in-memory compute operation. Analog signal voltages Va,T and Va,C develop over time on the pair of complementary bit lines BLT and BLC, respectively, falling from the precharge voltage Vdd in response to the pulse width(s) of those word line signals and the logic state of the bits of the computational weight stored in the memory cells 14. The representation of the analog voltage Va levels as shown is just an example. After all word line signals are deasserted for the computation cycle, the precharge off control signal PCHoff is deasserted to actuate the precharge circuitry of the precharge circuit 42 and the bit lines are precharged back to the precharge voltage level in preparation for a next computation cycle.

It will be noted that a risk exists that the analog voltage on at least one of the bit lines BLT and BLC may fall from the precharge (Vdd) voltage to a level where an unwanted data flip occurs with respect to the stored data bit value in one of the memory cells 14 of the column. For example, a logic "1" state stored in the cell 14 of a column may be flipped to a logic "0" state. This data flip introduces a data error in the computational weight stored in the memory cells, thus jeopardizing the accuracy of subsequent in-memory compute operations.

The unwanted data flip that occurs due to an excess of bit line voltage lowering is mainly an effect of the simultaneous parallel access of the word lines in matrix vector multiplication mode during the in-memory compute operation. This problem is different from normal data flip of an SRAM bit cell due to Static-Noise-Margin (SNM) issues which happens in serial bit cell access when the bit line is close to the level of the supply voltage Vdd. During serial access, the normal data flip is instead caused by a ground bounce of the data storage nodes QT or QC.

An additional concern arises from a desire to operate the SRAM array at relatively low supply voltages (for example, with Vdd on the order of 0.5 Volts to 1.2 Volts). In this scenario, the dynamic range for the swing of the analog signal voltages Va,T and Va,C on each pair of bit lines BLT and BLC during the in-memory compute operation is accordingly constrained. Furthermore, the magnitude of the bit line swing may approach a level where an enhanced risk of the unwanted data flip can occur.

There is a need in the art to support in-memory computation circuit with the use of SRAM cells operating at a low supply voltage level while ensuring against unwanted data flip during simultaneous row access and providing increased dynamic range for the developed analog voltages on the pair of complementary bit lines in support of higher output precision.

SUMMARY

In an embodiment, a circuit comprises: a memory array including a plurality of static random access memory (SRAM) cells arranged in a matrix with plural rows and plural columns, each row including a word line connected to the SRAM cells of the row, and each column including at least one bit line connected to the SRAM cells of the column; a word line driver circuit for each row having an output connected to drive the word line of the row; a row controller circuit configured to simultaneously actuate the plurality of word lines by applying pulses through the word line driver circuits to the word lines for an in-memory compute operation; a column processing circuit connected to the at least one bit line for each column and configured to process analog voltages developed on the bit lines in response to the simultaneous actuation of the plurality of word lines to generate a decision output for the in-memory compute operation; and a bit line precharge circuit configured to generate a precharge voltage for application to each pair of bit lines, wherein the precharge voltage has a first voltage level not greater than a positive supply voltage for the plurality of SRAM cells when the memory array is operating in a data read/write mode, and wherein the precharge voltage has a second voltage level greater than the first voltage level in advance of the simultaneous actuation of the plurality of word lines for the in-memory compute operation.

In an embodiment, a circuit comprises: a memory array including a plurality of memory cells arranged in a matrix with plural rows and plural columns, each row including a word line connected to the memory cells of the row, and each column including a bit line connected to the memory cells of the column; a word line driver circuit for each row having an output connected to drive the word line of the row; a row controller circuit configured to simultaneously actuate the plurality of word lines by applying pulses through the word line driver circuits to the word lines for an in-memory compute operation; a column processing circuit connected to the bit line for each column and configured to process analog voltages developed on the bit lines in response to the simultaneous actuation of the plurality of word lines to generate a decision output for the in-memory compute operation; and a bit line precharge circuit configured to generate a precharge voltage for application to each bit line in advance of the simultaneous actuation of the plurality of word lines for the in-memory compute operation, said precharge voltage having a voltage level that is greater than a positive supply voltage for the memory cells.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 4:
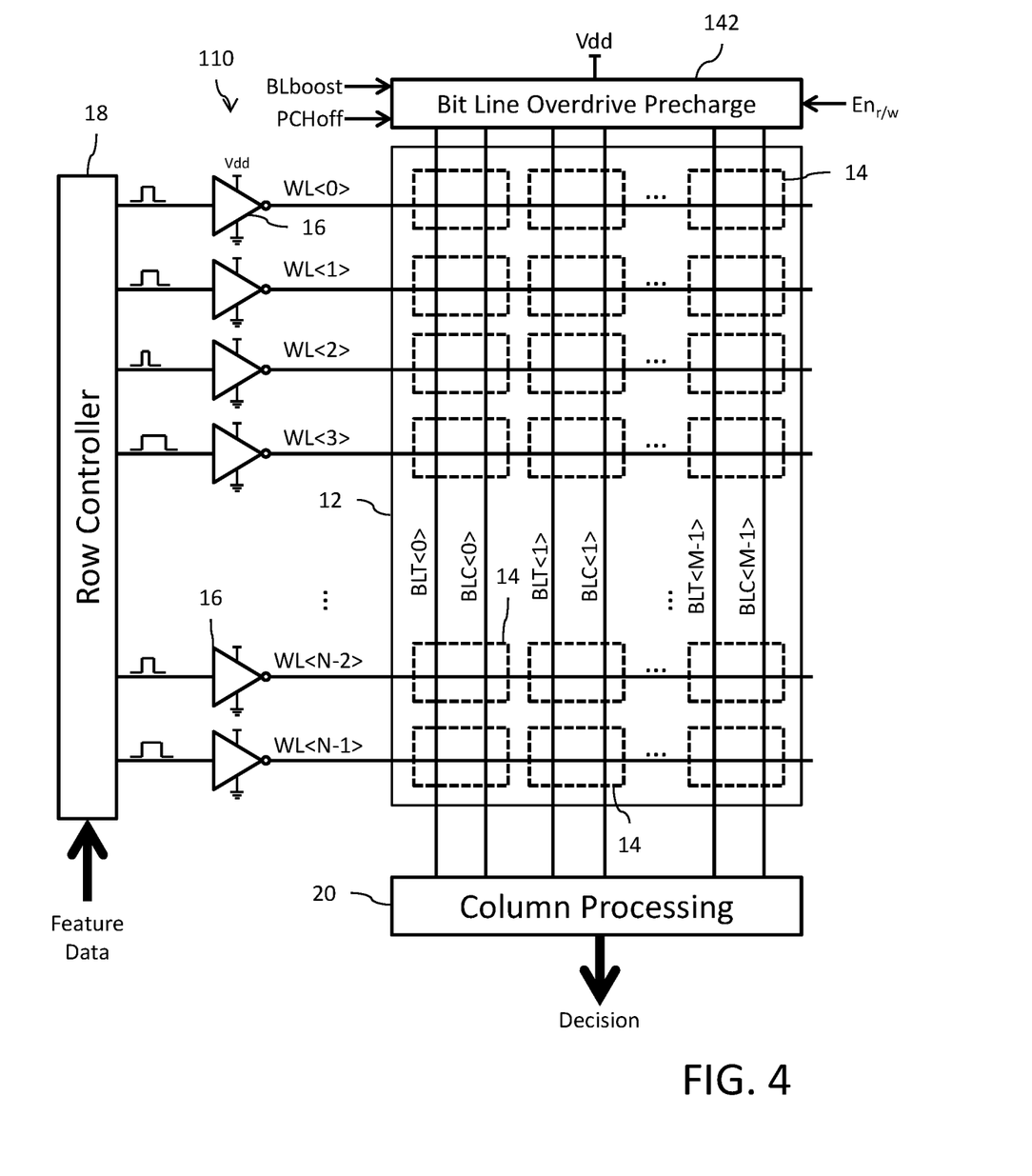
FIG. 4 is a schematic diagram of an in-memory computation circuit utilizing an adaptive bit line overdrive.

Reference is now made to FIG. 4 which shows a schematic diagram of an in-memory computation circuit 110 utilizing an adaptive bit line overdrive for precharging the pair of complementary bit lines BLT and BLC. Like references in FIGS. 1 and 4 refer to like or similar components, the description of which will not be repeated (see, description above). The circuit 110 differs from the circuit 10 in that a bit line overdrive precharge circuit 142 that is connected to each pair of complementary bit lines BLT and BLC operates for each computation cycle of the in-memory compute operation to precharge the bit lines BLT and BLC to an overdrive voltage Vod in excess of the positive supply voltage Vdd (which is powering the memory cells 14 of the array 12). Operation of the bit line overdrive precharge circuit 142 in connection with performance of a computation cycle of the in-memory compute operation is as follows. The deassertion (logic low) of a precharge off control signal PCHoff causes precharge circuitry of the bit line overdrive precharge circuit 142 to charge both bit lines in each pair to the high supply voltage Vdd level. The precharge off control signal PCHoff is then asserted to disable charging to the Vdd level by the precharge circuitry and the assertion (logic high) of a bit line boost signal BLboost causes boost circuitry within the bit line overdrive precharge circuit 142 to charge both bit lines in each pair to the overdrive voltage Vod level (where Vod>Vdd). This is followed by the simultaneous assertion (activation) of the word lines in parallel for the execution of the in-memory compute operation.

Figure 5:
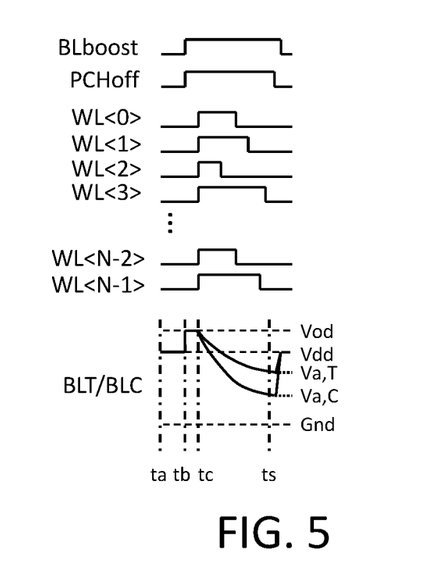
FIG. 5 is a timing diagram illustrating an in-memory compute operation for the circuit of FIG. 4.

FIG. 5 is a timing diagram showing deassertion (logic low) of the precharge off control signal PCHoff at time to which causes the precharge circuitry of the bit line overdrive precharge circuit 142 to charge each pair of complementary bit lines BLT and BLC to the Vdd voltage level. At this point in time, the bit line boost signal BLboost is in a deasserted state to deactivate the boost circuitry in the bit line overdrive precharge circuit 142. Next, an assertion (logic high) of both the precharge off control signal PCHoff and the bit line boost signal BLboost is made at time tb. At this point, the precharge circuitry is disabled and the boost circuitry is enabled to charge the pair of complementary bit lines BLT and BLC to the overdrive Vod voltage level. This is followed at time tc by the simultaneous application of the pulse width modulated word line signals (in response to the feature data) to plural rows of memory cells 14 in the SRAM array 12 for a given in-memory compute operation. Analog signal voltages Va,T and Va,C develop over time on the pair of complementary bit lines BLT and BLC, respectively, falling from the overdrive voltage Vod level in response to the pulse width(s) of the word line signals and the logic state of the bits of the computational weight stored in the memory cells 14. The representation of the analog voltage Va levels as shown is just an example. It will be noted that sampling of the analog signal voltages Va,T and Va,C is typically made by the column processing circuit 20 at any suitable time thereafter (see, for example, time ts). After all word line signals are deasserted for the computation cycle, both the precharge off control signal PCHoff and the bit line boost signal BLboost are deasserted to actuate the precharge circuitry in the bit line overdrive precharge circuit 142 and the bit lines are precharged back to the precharge voltage level Vdd in preparation for a next computation cycle. The higher overdrive Vod voltage level applied on the bit lines prior to the in-memory compute operation helps in ensuring a higher margin for bit line analog voltage swing and further minimizes the risk that the analog voltage level will fall to a point where an unwanted data flip occurs with respect to the stored data bit value in one of the memory cells 14 of the column.

It will be noted that operation of the boost circuitry to precharge the pair of complementary bit lines BLT and BLC to the overdrive voltage Vod level will impact the normal read/write performance of the SRAM array 12 when writing bits of the computational weight to, and reading bits of the computational weight from, the SRAM cells 14. Because of this, the operation of the boost circuitry within the bit line overdrive precharge circuit 142 to generate the overdrive voltage Vod level for the bit line precharge is disabled when the SRAM array 12 is being operated in the normal (conventional) data read/write mode. In such a situation where a read/write operation to the memory is implemented, the precharge circuitry within the bit line overdrive precharge circuit 142 is enabled to assert a precharge voltage that does not exceed the supply voltage Vdd for the memory cells (and in a preferred implementation may equal the supply voltage Vdd). The bit line overdrive precharge circuit 142 may, for example, receive an enable signal $EN_{r/w}$, that, when asserted (for example, logic low) disables operation by the boost circuitry to precharge to the overdrive voltage Vod level and permits precharge by the precharge circuitry only to a voltage level that is less than or equal to the supply voltage Vdd level.

Figure 6A:
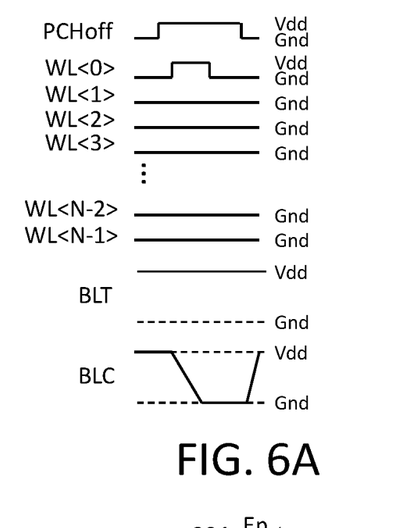
FIGS. 6A and 6B show timing diagrams for a memory read and memory write operation.
Figure 6B:
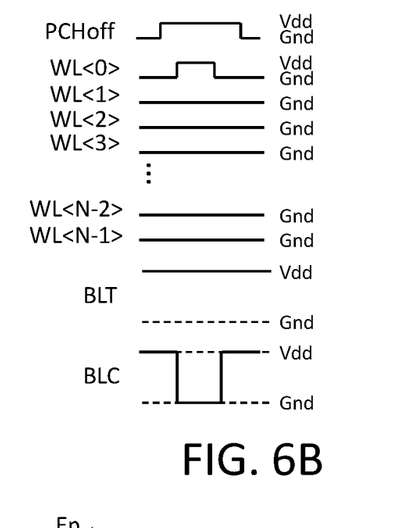

FIGS. 6A and 6B show timing diagrams for a memory read and memory write operation, respectively, using a bit line precharge to the supply voltage Vdd level because the boost circuitry of the bit line overdrive precharge circuit 142 has been disabled by setting the enable signal $EN_{r/w}$ to logic low. Note here the contrast to the in-memory compute operation shown in FIGS. 3 and 5 in that only a single word line (here, as an example, word line WL<0>) is asserted with a pulsed word line signal during the memory read and memory write operation. It will be noted that the illustration of bit line discharge to ground is by way of example only.

Figures 7, 8:
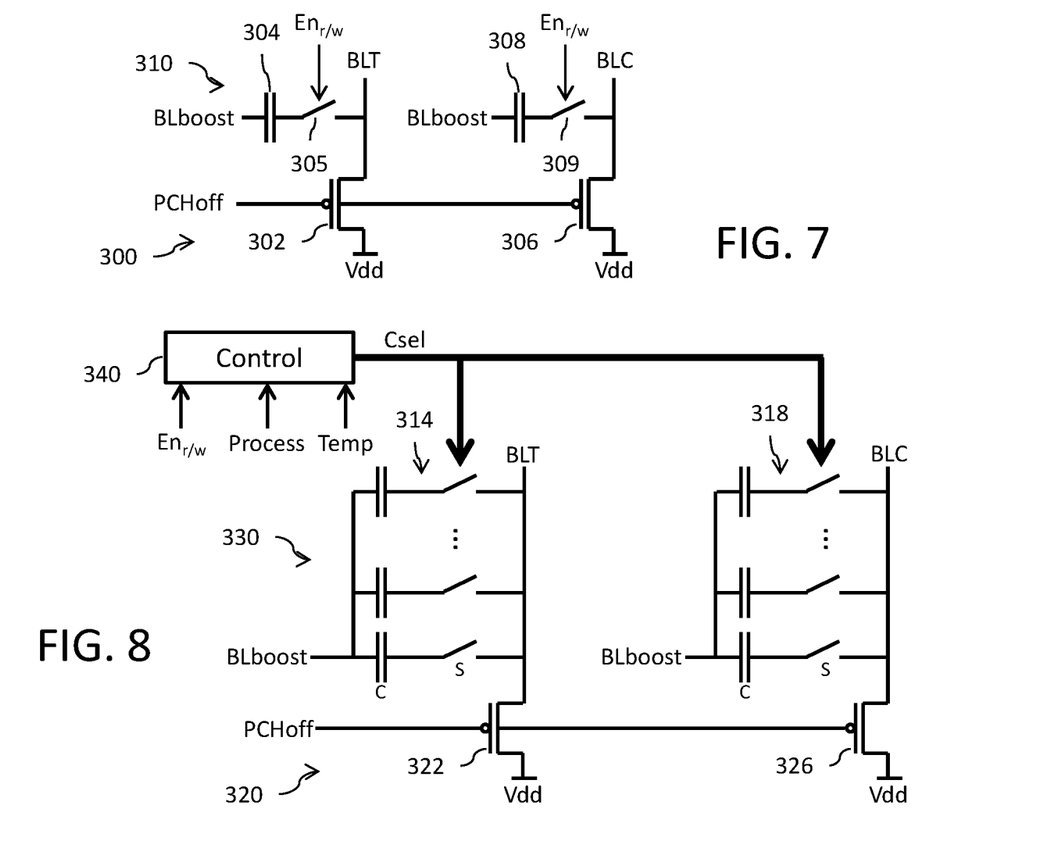
FIG. 7 is a circuit diagram for an embodiment of a circuit for providing the bit line overdrive voltage.
FIG. 8 is a circuit diagram for another embodiment of a circuit for providing the bit line overdrive voltage.

Reference is now made to FIG. 7 which shows a circuit diagram for an embodiment of the bit line overdrive precharge circuit 142 for selectively providing the bit line overdrive voltage Vod in response to the signals PCHoff and BLboost. The circuit 142 includes precharge circuitry 300 including a first p-channel MOSFET device 302 having a source coupled (preferably directly connected) to the supply voltage Vdd node and a drain coupled (preferably directly connected) to at least one, and preferably many if not all, of the true bit lines BLT, and a second p-channel MOSFET device 306 having a source coupled (preferably directly connected) to the supply voltage Vdd node and a drain coupled (preferably directly connected) to at least one, and preferably many if not all, of the complement bit lines BLC. The gates of the transistors 302 and 306 are coupled to receive the precharge off control signal PCHoff.

The circuit 142 further includes boost circuitry 310 including a first capacitor 304 having a first terminal coupled to receive the bit line boost signal BLboost and a second terminal coupled in series with a switch circuit 305 (which may be implemented by a transistor device) to the true bit line(s) BLT, and a second capacitor 308 having a first terminal coupled to receive the bit line boost signal BLboost and a second terminal coupled in series with a switch circuit 309 (which may be implemented by a transistor device) to the complement bit line(s) BLC. The first and second switch circuits 305 and 309 are controlled by the enable signal $EN_{r/w}$.

The circuit 142 operates as follows. When the enable signal $EN_{r/w}$ is deasserted (logic low) for normal read/write performance of the SRAM array 12, the first and second switch circuits 305 and 309 are open. When the precharge off control signal PCHoff is deasserted (logic low), transistors 302 and 306 are turned on and the true and complement bit lines BLT, BLC are precharged to the Vdd level. The normal operations for read/write as shown in FIGS. 6A and 6B may then be performed.

When the enable signal $EN_{r/w}$ is asserted (logic high) for the in-memory compute operation, however, the second terminals of the capacitors 304 and 308 are connected by the switches 305 and 309 to the true and complement bit lines BLT, BLC, respectively. The bit line boost signal BLboost is logic low at the first terminals of the capacitors 304 and 308. When the precharge off control signal PCHoff is deasserted (logic low), transistors 302 and 306 are turned on and a boost voltage is stored across the first and second capacitors 304 and 308. At this point, the voltage on the pair of complementary bit lines BLT, BLC is also pre charged to the Vdd level. When the precharge off control signal PCHoff is then asserted (logic high), transistors 302 and 306 are turned off to disconnect the supply voltage Vdd from the true and complement bit lines BLT, BLC. When the bit line boost signal BLboost is then asserted (logic high), the voltage on the pair of complementary bit lines BLC is boosted to the bit line overdrive voltage Vod level through the boost voltage stored on the first and second capacitors 304 and 308.

Reference is now made to FIG. 8 which shows a circuit diagram for an embodiment of the bit line overdrive precharge circuit 142 for selectively providing the bit line overdrive voltage Vod. The circuit 142 includes precharge circuitry 320 including a first p-channel MOSFET device 322 having a source coupled (preferably directly connected) to the supply voltage Vdd node and a drain coupled (preferably directly connected) to at least one, and preferably many if not all, of the true bit lines BLT, and a second p-channel MOSFET device 326 having a source coupled (preferably directly connected) to the supply voltage Vdd node and a drain coupled (preferably directly connected) to at least one, and preferably many if not all, of the complement bit lines BLC. The gates of the transistors 322 and 326 are coupled to receive the precharge off control signal PCHoff.

The circuit 142 further includes boost circuitry 330 including a plurality of switched capacitor circuits 314 connected in parallel and coupled between a node receiving the bit line boost signal BLboost and the true bit line(s) BLT, and a plurality of switched capacitor circuits 318 connected in parallel and coupled between a node receiving the bit line boost signal BLboost and the complement bit line(s) BLC. Each switched capacitor circuit 314, 318 includes a capacitor C connected in series with a switch S (which may be implemented by a transistor device). A digital control circuit 340 generates a multi-bit digital control signal Csel that selectively actuates one or more of the switches S of the switched capacitor circuits 314 and 318 in connection with both precharging the bit lines to the Vdd voltage and the generation and selective application of the bit line overdrive voltage Vod level.

The circuit 142 operates as follows. When the enable signal $EN_{r/w}$ is deasserted (logic low) for normal read/write performance of the SRAM array 12, the digital control circuit 340 controls all switches S of the switched capacitor circuits 314 and 318 to be open. When the precharge off control signal PCHoff is deasserted (logic low), transistors 322 and 326 are turned on and the true and complement bit lines BLT, BLC are precharged to the Vdd level. The normal operations for read/write as shown in FIGS. 6A and 6B may then be performed.

When the enable signal $EN_{r/w}$ is asserted (logic high) for the in-memory compute operation, however, the digital control circuit 340 enables selective actuation of the switches S of the switched capacitor circuits 314 and 318 to support modulation of the level of the bit line overdrive voltage Vod. The bit line boost signal BLboost is logic low. When the precharge off control signal PCHoff is deasserted (logic low), transistors 322 and 326 are turned on and a boost voltage is stored across each of the capacitors C whose corresponding switch S has been actuated (selected) by the digital control circuit 340. At this point, the voltage on the pair of complementary bit lines BLT, BLC is also pre charged to the Vdd level. When the precharge off control signal PCHoff is then asserted (logic high), transistors 322 and 326 are turned off to disconnect the supply voltage Vdd from the true and complement bit lines BLT, BLC. When the bit line boost signal BLboost is then asserted (logic high), the voltage on the pair of complementary bit lines BLC is boosted to the bit line overdrive voltage Vod level through the boost voltage(s) stored on the selected capacitors C.

The selective actuation of the switches S provides flexibility for modulating the level of the bit line overdrive voltage Vod. This provides opportunity to program the overdrive voltage level in response to operating condition such as: setting the overdrive level in response to write disturb issues during multirow access; adjusting the overdrive level up or down, depending on the number of word lines being accessed, in order to optimize power without sacrificing output precision; and controlling the overdrive level dependent on process condition and/or temperature to set a desired power, performance, area (PPA) characteristic.

With respect to the modulation of the level of the bit line overdrive voltage Vod dependent on integrated circuit process information, the digital control circuit 340 can be supplied with process data concerning whether the MOSFET devices of the memory cells 12 are, for example, at the fast-slow (where NMOS speed is fast and PMOS speed is slow) or fast-fast (where NMOS speed is fast and PMOS speed is fast) process corner. In response to such information, the digital control circuit 340 can assert bits of the multi-bit digital control signal Csel so as to control the selection of switched capacitor circuits 314 and 318 to provide a relatively higher voltage level for the bit line overdrive voltage Vod. Similarly, with respect to the modulation of the level of the bit line overdrive voltage Vod dependent on integrated circuit temperature information, the digital control circuit 340 can be supplied with data concerning current temperature conditions. In response to such information, the digital control circuit 340 can assert bits of the multi-bit digital control signal Csel so as to control the selection of switched capacitor circuits 314 and 318 to adjust the level of the bit line overdrive voltage Vod to mitigate the write disturb issue during multirow access and/or optimize operation at a desired PPA point.

Figure 9:
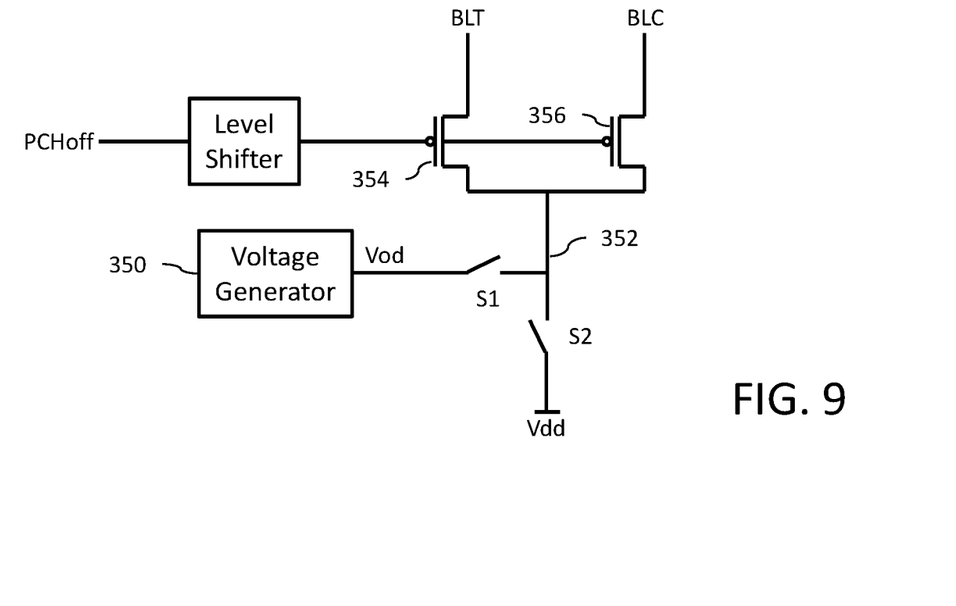
FIG. 9 is a circuit diagram for a further embodiment of a circuit for providing the bit line overdrive voltage.

Reference is now made to FIG. 9 which shows a circuit diagram for an embodiment of the bit line overdrive precharge circuit 142 for providing the bit line overdrive voltage Vod. The circuit 142 includes a voltage generator circuit 350 configured to generate the bit line overdrive voltage Vod. The voltage generator circuit 350 may, for example, comprise a voltage regulator circuit (such as a low drop-out (LDO) regulator) that generates the bit line overdrive voltage Vod from an input voltage. Alternatively, the voltage generator circuit 350 may, for example, comprise a charge pump circuit that generates the bit line overdrive voltage Vod from the supply voltage Vdd. The output of the voltage generator circuit 350 is selectively coupled to an intermediate supply node 352 through a first switch S1. The supply voltage Vdd is selectively coupled to the intermediate supply node 354 through a second switch S2. When in the in-memory compute mode of operation, the first switch S1 is closed and the second switch S2 is open. When in the normal memory read/write mode of operation, the first switch S1 is open and the second switch S2 is closed. The switches S1 and S2 (which may be implemented by transistor devices) may, for example, be controlled by logical inversions of the enable signal $EN_{r/w}$, such that switch S1 is open and switch S2 is closed when the enable signal $EN_{r/w}$ is asserted (for example, logic low), and vice versa when the enable signal $EN_{r/w}$ is deasserted (for example, logic high). The circuit 142 further includes a first p-channel MOSFET device 354 having a source coupled (preferably directly connected) to the intermediate supply node 334 and a drain coupled (preferably directly connected) to one or more of the true bit lines BLT. A gate of the transistor 354 is coupled to receive a level shifted version of the precharge off control signal PCHoff. A second p-channel MOSFET device 356 has a source coupled (preferably directly connected) to the intermediate supply node 334 and a drain coupled (preferably directly connected) to one or more of the complement bit lines BLC. A gate of the transistor 356 is also coupled to receive the level shifted version of the precharge off control signal PCHoff.

The circuit 142 operates as follows. If the enable signal $EN_{r/w}$ is asserted (logic low) because the memory array is operating in read/write mode, switch S2 is closed, switch S1 is open, and the supply voltage Vdd is applied to the intermediate supply node 352. With the precharge off control signal PCHoff deasserted (logic low), the transistors 354 and 356 are turned on and the pair of complementary bit lines BLT and BLC are precharged to the supply voltage Vdd. When the precharge off control signal PCHoff is subsequently deasserted (logic high) in connection with performing a read to or write from operation with respect to the memory array 12, the transistors 354 and 356 are turned off. Conversely, if the enable signal $EN_{r/w}$ is deasserted (logic high) because the in-memory computation circuit is performing an in-memory compute operation, switch S1 is closed, switch S2 is open, and the bit line overdrive voltage Vod output from the voltage generator circuit 350 is applied to the intermediate supply node 352. With the precharge off control signal PCHoff deasserted (logic low), the transistors 354 and 356 are turned on and the pair of complementary bit lines BLT and BLC are precharged to the bit line overdrive voltage Vod level. When the precharge off control signal PCHoff is subsequently deasserted (logic high) in connection with performing the in-memory compute operation with respect to the memory array 12, the transistors 354 and 356 are turned off and the analog voltage levels on the bit lines BLT and BLC are permitted to develop.

Figure 10:
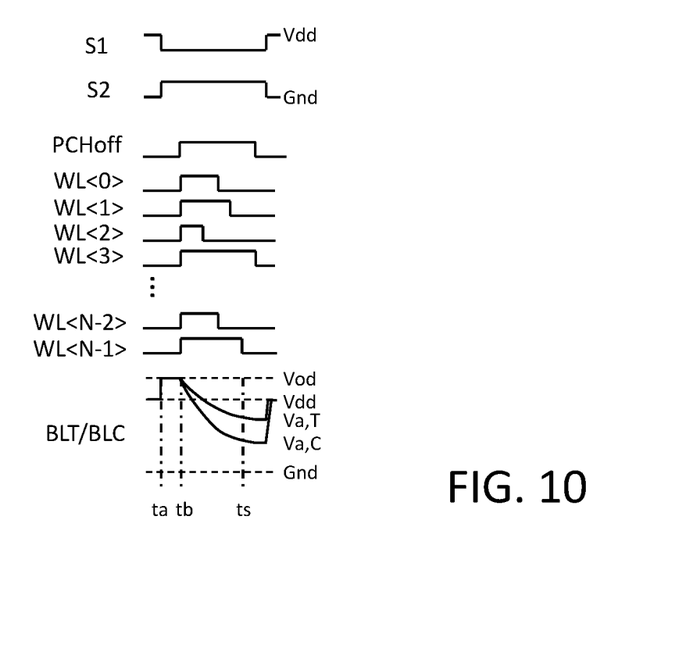
FIG. 10 is a timing diagram illustrating an in-memory compute operation in connection with the embodiment of FIG. 9.

The timing for this operation with the circuit 142 of FIG. 9 is slightly different than what is shown in FIG. 5, and reference is instead made to FIG. 10 which shows the relationship between the logic states of the precharge off control signal PCHoff and the overdrive voltage bit line precharge and in-memory compute operation. The assertion of the signal S1 causes the pair of complementary bit lines BLT and BLC to be charged to pre-charge voltage level Vdd. The deassertion (logic low) of the signal S1, along with the assertion (logic high) of the signal S2, at time to permits a change in the charge on the bit lines to the overdrive voltage level Vod. The precharge off control signal PCHoff controls conductivity of the transistors 354 and 356 to permit the Vdd and Vod voltages to charge the bit lines. The subsequent assertion (logic high) of the precharge off control signal PCHoff turns off the transistors 354 and 356. At time tb, there is a simultaneous application of the pulse width modulated word line signals to plural rows of memory cells 14 in the SRAM array 12 in response to the feature data for a given in-memory compute operation. Analog signal voltages Va,T and Va,C develop over time on the pair of complementary bit lines BLT and BLC, respectively, falling from the overdrive voltage Vod level in response to the pulse width(s) of the word line signals and the logic state of the bits of the computational weight stored in the memory cells 14. The representation of the analog voltage Va levels as shown is just an example. It will be noted that sampling of the analog signal voltages Va,T and Va,C is typically made by the column processing circuit 20 at any suitable time thereafter (see, for example, time ts). After sampling, the precharge off control signal PCHoff is deasserted to turn on transistors 154 and 356 and the switch signal S1 is asserted so that the precharge circuitry charges the bit lines BLT, BLC back to the precharge voltage level Vdd. The higher overdrive Vod voltage level on the bit lines helps in ensuring a higher margin for bit line analog voltage swing and further minimizes the risk that the analog voltage level will fall to a point where an unwanted data flip occurs with respect to the stored data bit value in one of the memory cells 14 of the column.

Figure 11:
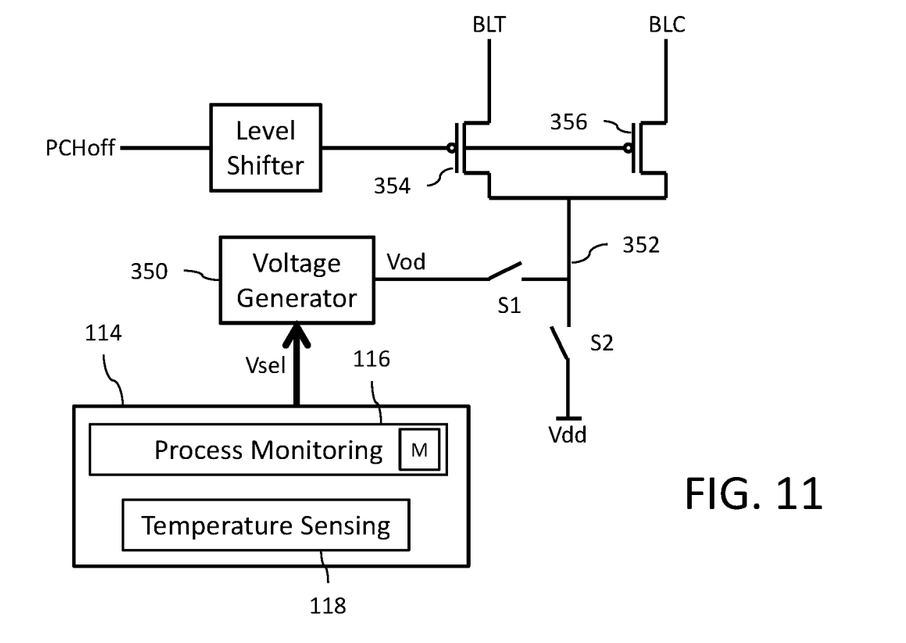
FIG. 11 is a circuit diagram for yet another embodiment of a circuit for providing the bit line overdrive voltage.

Reference is now made to FIG. 11 which shows a circuit diagram for an embodiment of the bit line overdrive precharge circuit 142 for providing the bit line overdrive voltage Vod. Like references in FIGS. 9 and 11 refer to like or similar components, the description of which will not be repeated (see, description above). The circuit in FIG. 11 differs from the circuit in FIG. 9 in that the level of the bit line overdrive voltage Vod is modulated dependent on integrated circuit process and/or temperature conditions.

The voltage generator circuit 350 receives a control signal Vsel. In an embodiment the signal Vsel is a digital control signal, but it will be understood that an analog control signal could instead be utilized. The digital values of the bits of the control signal Vsel select the level of the bit line overdrive voltage Vod output by the voltage generator circuit 350. The control signal Vsel is generated by a control circuit 114 in response to integrated circuit process and/or temperature information, and thus the level of the bit line overdrive voltage Vod is modulated in a manner which is dependent on that integrated circuit process and/or temperature information.

The integrated circuit process information is a digital code stored in a memory M within the control circuit 114. The digital code represents the centering of the process lot and is generated by circuitry such as, for example, ring oscillators (RO) whose output frequency varies dependent on integrated circuit process. The output frequencies of the RO circuits thus represent the process centering and can easily be converted into a digital code (for example, through the use of counter circuits). A process monitoring circuit 116 within the control circuit 114 can generate the digital value of the control signal Vsel as a function of the stored digital code for the integrated circuit process. For example, the process monitoring circuit 116 may include a look-up table (LUT) that correlates each digital code with a digital value of the control signal Vsel for providing a specific level of the bit line overdrive voltage Vod that will produce an optimal performance of the in-memory compute operation for the integrated circuit process corner in term of, for example, limiting power loss due to bit line toggling and limiting the wide range of levels for sensing circuitry before output irrespective of process and/or temperature. The control circuit 114 outputs the digital value of the control signal Vsel correlated to the stored digital code and the voltage generator circuit 350 responds by generating the corresponding level for the bit line overdrive voltage Vod.

The temperature information is generated by a temperature sensing circuit 118 and represents a current temperature of the integrated circuit. The temperature sensing circuit 118 may select, modify or adjust the digital value of the control signal Vsel as a function of the sensed temperature. For example, the temperature sensing circuit 118 may include a look-up table (LUT) that specifies a certain (positive or negative) adjustment in the digital value of the control signal Vsel for providing a corresponding tuning of the specific level of the bit line overdrive voltage Vod that will produce optimal performance given the integrated circuit process corner and current temperature condition.

Figure 12:
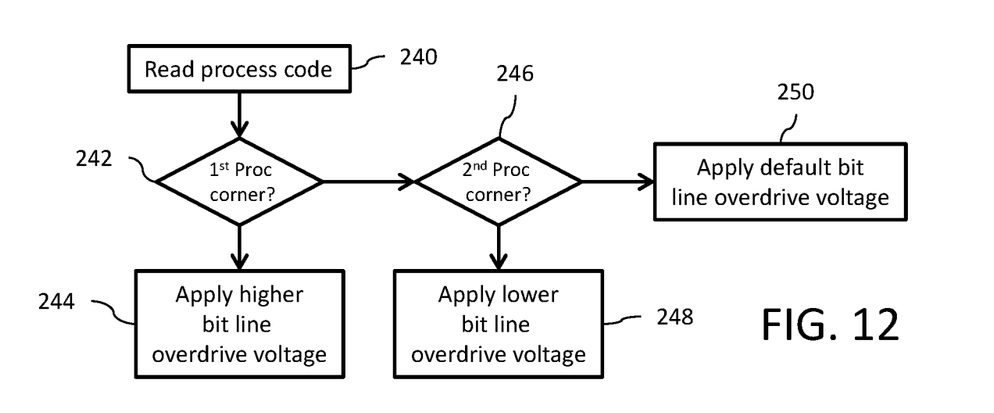
FIG. 12 is a flow diagram.

Reference is now made to FIG. 12 which shows a flow diagram for operation of the control circuit 114 and process monitoring circuit 116 for the circuit of FIG. 11. In step 240, the stored digital code for the integrated circuit process is read from the memory M. In an embodiment, the digital code for the integrated circuit process is loaded at the factory into the memory M, and this digital code is based on the identified integrated circuit process characteristic (fast/slow corner, etc.) for the integrated circuit fabrication lot (for example, the source wafer) from which the integrated circuit is obtained. Next, in step 242, a determination is made as to whether the read digital code for the integrated circuit process indicates that the MOSFET devices of the memory cells 12 are at certain integrated circuit process corner. If yes, then a digital value of the control signal Vsel is selected in step 244 which corresponds to the read digital code and which will cause the voltage generator circuit 350 to generate a higher degree of bit line overdrive (i.e., the level for the adaptive bit line overdrive voltage Vod will be higher than a nominal (or default) level). The effect of the increase in the bit line overdrive voltage Vod level higher than the nominal (or default) level during multirow access ensures that the bit line discharge level does not exceed the write disturb level and further ensures a higher headroom availability for bit line swing in support of a higher output precision. If no in step 144, then in step 246 a determination is made as to whether the read digital code for the integrated circuit process indicates that the MOSFET devices of the memory cells 12 are at another integrated circuit process corner. If yes, then a digital value of the control signal Vsel is selected in step 248 which corresponds to the read digital code and which will cause the voltage generator circuit 350 to generate a lower degree of bit line overdrive (i.e., the level for the adaptive bit line overdrive voltage Vod will be lower than the nominal (or default) level). The effect of the decrease in the bit line overdrive voltage Vod level lower than the nominal (or default) level is to ensure bit line level optimization to limit power loss due to bit line toggling and limit the wide range of levels for the sensing circuitry before output irrespective or process/temperature condition. If no in step 246, then in step 250 a digital value of the control signal Vsel is selected which corresponds to the read digital code and which will cause the voltage generator circuit 350 to generate a level for the bit line overdrive voltage Vod that is equal to the nominal (or default) level.

Although the process of FIG. 12 contemplates three levels of voltage control (higher than, lower than, and equal to, nominal), it will be understood that this is by example only. Additional testing steps may be added to the process of FIG. 12 to test for other integrated circuit process corner or process-related conditions, with each test having an associated digital code and digital value of the control signal Vsel for setting a corresponding level of the bit line overdrive voltage Vod generated by the voltage generator circuit 350.

Figure 13:
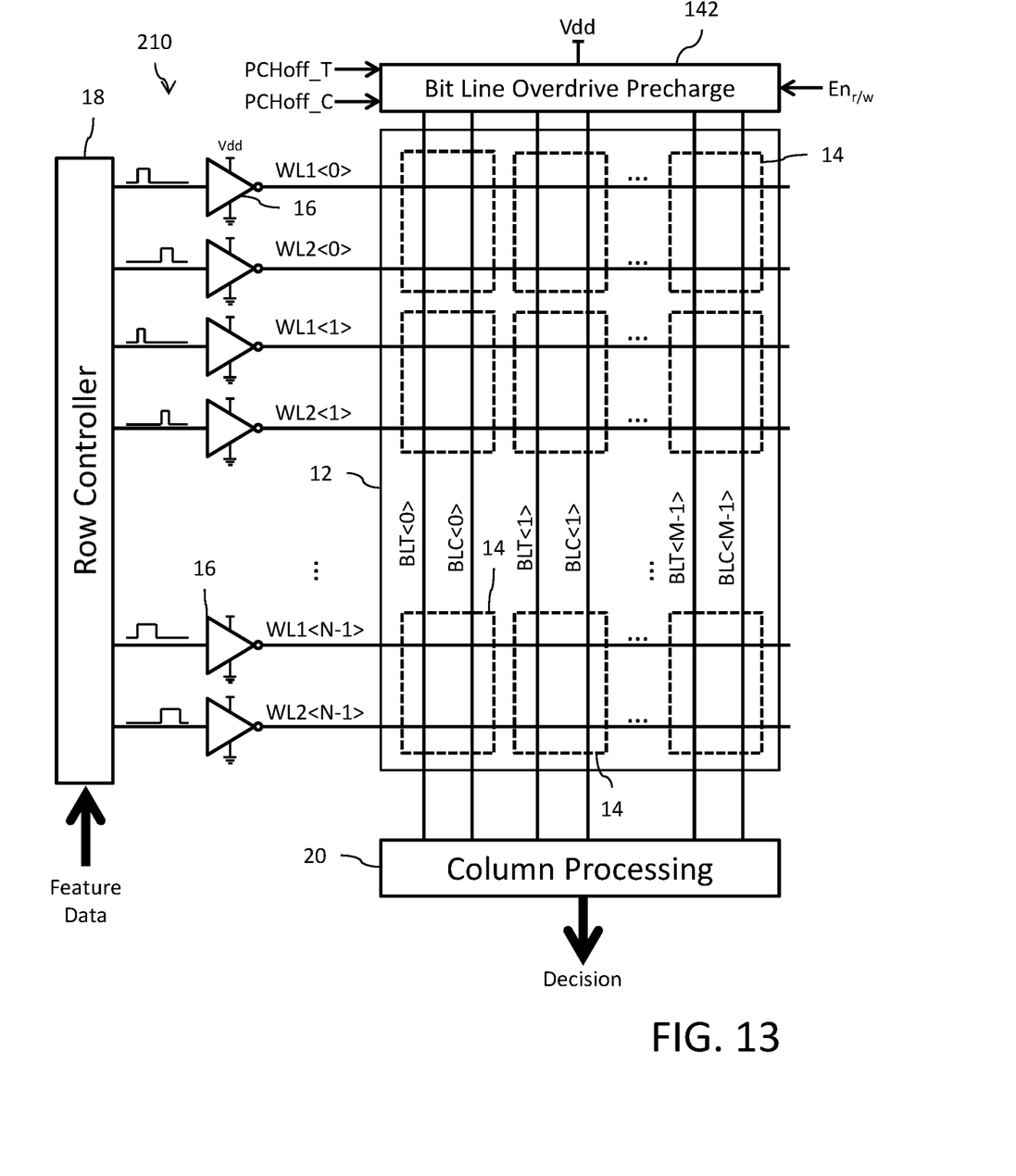
FIG. 13 is a circuit diagram for an embodiment of a circuit for providing a time multiplexed bit line overdrive voltage and access.
Figure 14:
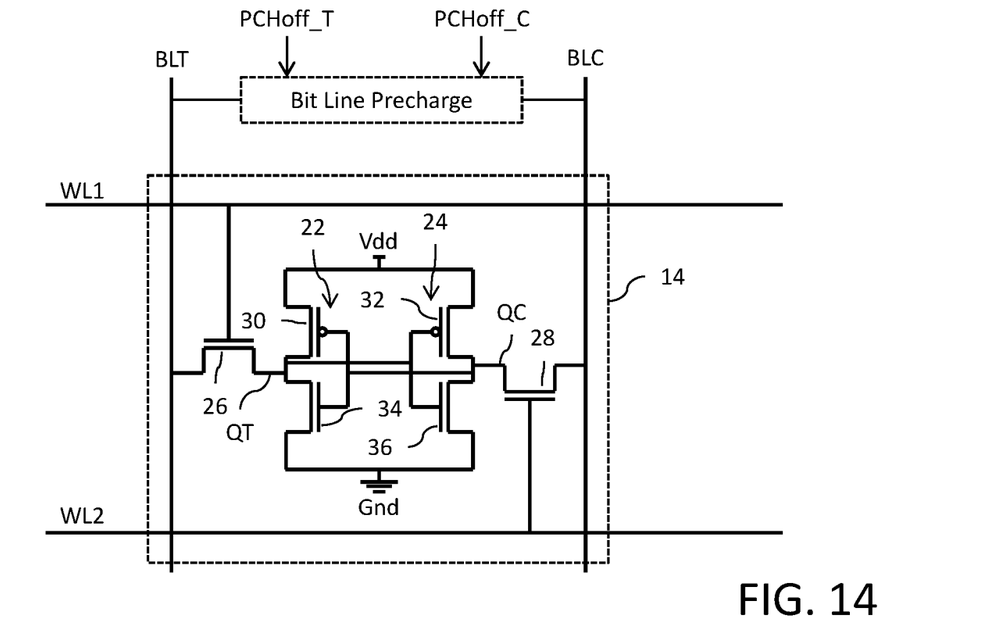
FIG. 14 is a circuit diagram of the 6T SRAM cell as used the memory array of the in-memory computation circuit shown in FIG. 13.

Reference is now made to FIG. 13 which shows a schematic diagram of an in-memory computation circuit 210 utilizing an adaptive bit line overdrive for precharging the pair of complementary bit lines BLT and BLC. Like references in FIGS. 4 and 13 refer to like or similar components, the description of which will not be repeated (see, description above). The circuit 210 differs from the circuit 110 in that word line access control for the true and complement sides of each SRAM cell has been split as shown in more detail in FIG. 14. Each cell 14 includes a first transfer (passgate) transistor 26 for the true side of the latch having a gate terminal driven by a first word line WL1. Transistor 26 is source-drain connected between the true data storage node QT and a node associated with a true bit line BLT. Each cell 14 further includes a second transfer (passgate) transistor 28 for the complement side of the latch having a gate terminal driven by a second word line WL2. Transistor 28 is source-drain connected between the complement data storage node QC and a node associated with a complement bit line BLC. With this configuration, independent control over word line access to each side of the memory cell 14 can be made. The circuit further supports the performance of one phase (a first phase p1) of the in-memory compute operation associated with actuation of only the first word lines WL1 in response to the feature data to access/read the true side of the latch and the performance of another phase (a second phase p2) of the in-memory compute operation associated with actuation of only the second word lines WL2 in response to the feature data to access/read the complement side of the latch. The first and second word lines WL1 and WL2 will having word line signals generated from the same feature data and thus have the same pulse width.

The circuit 210 further differs from the circuit 110 in that the bit line overdrive precharge circuit 142 connected to each pair of complementary bit lines BLT and BLC operates to independently precharge bit lines BLT and BLC to the overdrive voltage Vod for the in-memory compute operation. In response to a deassertion (logic low) of a first precharge off control signal PCHoff T, the precharge circuitry of the bit line overdrive precharge circuit 142 charges the true bit line BLT in each pair to the high supply (precharge) voltage Vdd level. Then, in response to an assertion (logic high) of the first precharge off control signal PCHoff T, boost circuitry of the bit line overdrive precharge circuit 142 charges the true bit line BLT in each pair to the overdrive voltage Vod level in connection with the performance of one phase of the in-memory compute operation associated with actuation of only the first word lines WL1. Similarly, in response to a deassertion (logic low) of a second precharge off control signal PCHoff C, the precharge circuitry of the bit line overdrive precharge circuit 142 charges the complement bit line BLC in each pair to the high supply (precharge) voltage Vdd level. Then, in response to an assertion (logic high) of the second precharge off control signal PCHoff C, boost circuitry of the bit line overdrive precharge circuit 142 charges the complement bit line BLC in each pair to the overdrive voltage Vod level in connection with the performance of another phase of the in-memory compute operation associated with actuation of only the second word lines WL2.

Figure 15:
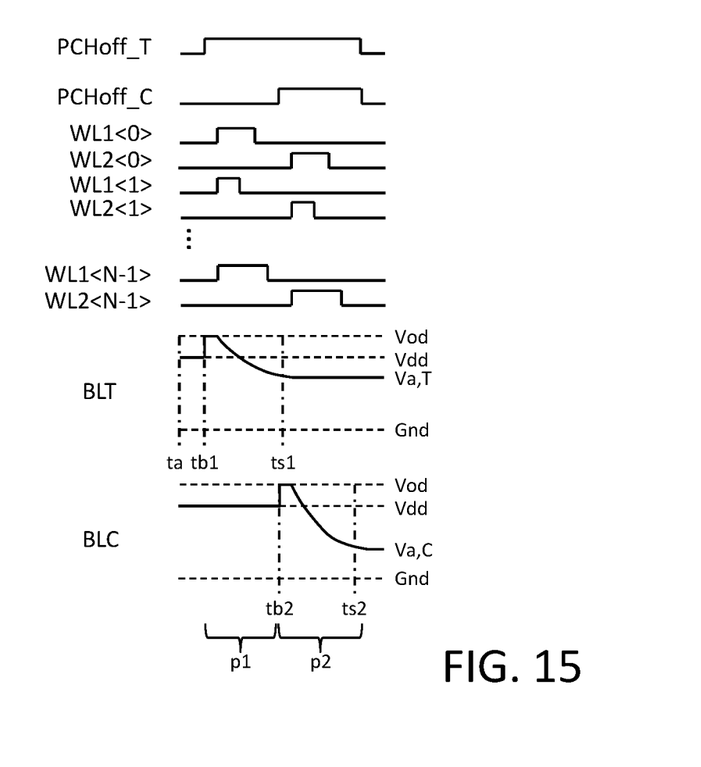
FIG. 15 is a timing diagram illustrating an in-memory compute operation for the circuit of FIG. 13.

FIG. 15 is a timing diagram showing circuit operation for a computation cycle of an in-memory compute operation that is executed in a time multiplexed manner with respect to the true and complement sides of the latches for the SRAM cells in a given column of the array. The true bit lines BLT and the complement bit lines BLC are both precharged by the bit line precharge circuit at time to a desired voltage level (here shown, by way of example, to the Vdd voltage level, although other voltage levels could be selected) in response to a deasserted (logic low) state of the first and second precharge off control signals PCHoff T, PCHoff C. In a first phase p1 of the computation cycle for the in-memory compute operation, the first precharge off control signal PCHoff T is asserted (logic high) at time tb1 and the boost circuitry charges the true bit lines BLT to the overdrive Vod voltage level. A simultaneous application of the pulse width modulated word line signals in response to the feature data for a given in-memory compute operation is then made to only the first word lines WL1 of plural rows of memory cells 14 in the SRAM array 12. An analog signal voltage Va,T develops over time on the true bit line BLT, falling from the overdrive voltage Vod in response to the pulse width(s) of those word line signals and the logic state of the bits of the computational weight stored on the true side of the memory cells 14. The representation of the analog voltage Va,T level as shown is just an example.

In a second phase p2 of the computation cycle for the in-memory compute operation, the second precharge off control signal PCHoff C is asserted (logic high) at time tb2 and the boost circuitry charges the complement bit lines BLC to the overdrive Vod voltage level. Responsive to the feature data, a simultaneous application of the same pulse width modulated word line signals for the given in-memory compute operation is then made to only the second word lines WL2 of plural rows of memory cells 14 in the SRAM array 12. An analog signal voltage Va,C develops over time on the complement bit line BLC, falling from the overdrive voltage Vod in response to the pulse width(s) of those word line signals and the logic state of the bits of the computational weight stored on the complement true side of the memory cells 14. The representation of the analog voltage Va,C level as shown is just an example.

After all word line signals are deasserted, the first and second precharge off control signals PCHoff T and PCHoff C are deasserted at the end of the computation cycle to actuate the precharge circuitry in the bit line overdrive precharge circuit 142 and the true and complement bit lines are precharged back to the precharge voltage level. In an embodiment, the first precharge off control signal PCHoff T may be deasserted after all of the first word line signals are deasserted, and the second precharge off control signal PCHoff C may be deasserted after all of the second word line signals are deasserted.

The column processing circuit 20 senses the analog signal voltages on the pairs of complementary bit lines BLT and BLC for the M columns and generates a decision output for the in-memory compute operation from those analog signal voltages. It will be noted that sampling of the analog signal voltages Va,T and Va,C is typically made by the column processing circuit 20 at two separate times, first in association with the simultaneous application of the pulse width modulated word line signals to the first word lines WL1 during the first phase p1 (at time ts1), where access is being made to the true side of the latch circuit, and second in association with the simultaneous application of the pulse width modulated word line signals to the second word lines WL1 during the second phase p2 (at time ts2), where access is being made to the complement side of the latch circuit.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
a memory array including a plurality of static random access memory (SRAM) cells arranged in a matrix with plural rows and plural columns, each row including a word line connected to the SRAM cells of the row, and each column including at least one bit line connected to the SRAM cells of the column;
a word line driver circuit for each row having an output connected to drive the word line of the row;
a row controller circuit configured to simultaneously actuate the plurality of word lines by applying pulses through the word line driver circuits to the word lines for an in-memory compute operation;
a column processing circuit connected to the at least one bit line for each column and configured to process analog voltages developed on the bit lines in response to the simultaneous actuation of the plurality of word lines to generate a decision output for the in-memory compute operation; and
a bit line precharge circuit configured to generate a precharge voltage for application to the at least one bit line for each column, wherein the precharge voltage has a first voltage level not greater than a positive supply voltage for the plurality of SRAM cells when the memory array is operating in a data read/write mode, and wherein the precharge voltage has a second voltage level greater than the first voltage level in advance of the simultaneous actuation of the plurality of word lines for the in-memory compute operation.

2. The circuit of claim 1, wherein the bit line precharge circuit includes a voltage boosting circuit configured to boost the precharge voltage from the first voltage level to the second voltage level in response to a control signal generated in response to an end of precharge to the first voltage level.

3. The circuit of claim 2, wherein the boost of the precharge voltage is provided by a capacitive voltage boosting circuit comprising:
- a capacitor having a first terminal coupled to receive the control signal and a second terminal coupled to the bit line;
- a switch coupled in series with the capacitor between the control signal and the bit line; and
- a control circuit configured to selectively actuate the switch.

4. The circuit of claim 3, wherein the control circuit selectively actuates said switch in response to information concerning integrated circuit process and/or temperature conditions in order to set the second voltage level.

5. The circuit of claim 3, wherein the control circuit deactuates said switch in response to operation of the memory array in data read/write mode.

6. The circuit of claim 2, wherein the boost of the precharge voltage is provided by a capacitive voltage boosting circuit comprising:
- a plurality of switched capacitor circuits coupled in parallel between the control signal and the bit line, each switched capacitor circuit comprising a capacitor coupled in series with a switch; and
- a control circuit configured to selectively actuate the switches of the plurality of switched capacitor circuits.

7. The circuit of claim 6, wherein the control circuit selectively actuates certain ones of said switches in response to information concerning integrated circuit process and/or temperature conditions in order to set the second voltage level.

8. The circuit of claim 6, wherein the control circuit deactuates said switches in response to operation of the memory array in data read/write mode.

9. The circuit of claim 1, wherein the bit line precharge circuit includes:
- a voltage generating circuit configured to generate the second voltage level of the precharge voltage; and
- a switching circuit configured to selectively apply one of the first and second voltage levels to the bit line in response to a first control signal.

10. The circuit of claim 9, wherein the first control signal is indicative of whether the memory array is operating for performing the in-memory compute operation where the switching circuit selectively applies the second voltage level to an intermediate node, or operating in the data read/write mode where the switching circuit selectively applies the first voltage level to the intermediate node.

11. The circuit of claim 10, wherein the bit line precharge circuit further includes a transistor having a source-drain path coupled between the intermediate node and the bit line, said transistor having a gate configured to receive a second control signal that is indicative of actuation of a precharge operation for the bit lines.

12. The circuit of claim 1, wherein the bit line precharge circuit includes a voltage generating circuit configured to generate the precharge voltage, wherein the voltage generating circuit is controlled to generate the second voltage level, and further comprising a control circuit configured to generate a control signal for application to the voltage generator circuit.

13. The circuit of claim 12, wherein the control signal is configured to cause modulation of the second voltage level away from a nominal level in response to an applicable integrated circuit process corner for transistor devices of the SRAM cells.

14. The circuit of claim 13, wherein the applicable integrated circuit process corner is indicated by a programmed code stored in the control circuit, and wherein the control circuit includes a lookup table (LUT) correlating the programmed code to a value of the control signal.

15. The circuit of claim 13, wherein the control circuit further comprises a temperature sensor, and wherein the control signal is configured to cause a temperature dependent tuning of the second voltage level in response to applicable integrated circuit process corner.

16. The circuit of claim 15, wherein the control circuit includes a lookup table (LUT) correlating sensed integrated circuit temperature to a tuning level for the value of the control signal.

17. The circuit of claim 12, wherein the control circuit further comprises a temperature sensor, and wherein the control signal is configured to cause modulation of the second voltage level away from a nominal level in response to an integrated circuit temperature sensed by the temperature sensor.

18. The circuit of claim 17, wherein the control circuit includes a lookup table (LUT) correlating sensed integrated circuit temperature to a value of the control signal.

19. The circuit of claim 1, where said at least one bit line comprises a pair of bit lines and wherein the word line connected to the SRAM cells of the row comprises:
- a first word line configured to drive a first passgate transistor of the SRAM cell coupled between a first data node and one bit line of the pair of bit lines;
- a second word line configured to drive a second passgate transistor of the SRAM cell coupled between a second data node another bit line of the pair of bit lines;
- wherein said row controller circuit is configured to simultaneously actuate the first word lines in a first phase of the in-memory compute operation and then simultaneously actuate the second word lines in a second phase of the in-memory compute operation.

20. The circuit of claim 19, wherein the bit line precharge circuit configured to:
- generate the precharge voltage at the second voltage level for application to said one bit line of each pair of bit lines in advance of the first phase of the in-memory compute operation; and
- generate the precharge voltage at the second voltage level for application to said another bit line of each pair of bit lines in advance of the second phase of the in-memory compute operation.

21. The circuit of claim 20, wherein the bit line precharge circuit is further configured to hold said another bit line of each pair of bit lines to the first voltage level in advance of the first phase of the in-memory compute operation.

22. A circuit, comprising:
- a memory array including a plurality of memory cells arranged in a matrix with plural rows and plural columns, each row including a word line connected to the memory cells of the row, and each column including a bit line connected to the memory cells of the column;

a word line driver circuit for each row having an output connected to drive the word line of the row;

a row controller circuit configured to simultaneously actuate the plurality of word lines by applying pulses through the word line driver circuits to the word lines for an in-memory compute operation;

a column processing circuit connected to the bit line for each column and configured to process analog voltages developed on the bit lines in response to the simultaneous actuation of the plurality of word lines to generate a decision output for the in-memory compute operation; and a bit line precharge circuit configured to generate a precharge voltage for application to each bit line in advance of the simultaneous actuation of the plurality of word lines for the in-memory compute operation, said precharge voltage having a voltage level that is greater than a positive supply voltage for the memory cells.

23. The circuit of claim 22, further comprising a voltage generator circuit configured to generate said precharge voltage, wherein the voltage level of the precharge voltage is dependent on information concerning integrated circuit process and/or temperature conditions.

24. The circuit of claim 22, further comprising a voltage boosting circuit configured to generate said precharge voltage, wherein the voltage level of the precharge voltage is dependent on information concerning integrated circuit process and/or temperature conditions.

25. The circuit of claim 22, wherein the bit line precharge circuit includes a voltage generating circuit configured to generate the precharge voltage, wherein the voltage generating circuit is controlled to generate the voltage level, and further comprising a control circuit configured to generate a control signal for application to the voltage generator circuit.

26. The circuit of claim 25, wherein the control signal is configured to cause modulation of the voltage level away from a nominal level in response to an applicable integrated circuit process corner for transistor devices of the memory cells.

27. The circuit of claim 26, wherein the applicable integrated circuit process corner is indicated by a programmed code stored in the control circuit, and wherein the control circuit includes a lookup table (LUT) correlating the programmed code to a value of the control signal.

28. The circuit of claim 26, wherein the control circuit further comprises a temperature sensor, and wherein the control signal is configured to cause a temperature dependent tuning of the second voltage level in response to applicable integrated circuit process corner.

29. The circuit of claim 28, wherein the control circuit includes a lookup table (LUT) correlating sensed integrated circuit temperature to a tuning level for the value of the control signal.

30. The circuit of claim 25, wherein the control circuit further comprises a temperature sensor, and wherein the control signal is configured to cause modulation of the second voltage level away from a nominal level in response to an integrated circuit temperature sensed by the temperature sensor.

31. The circuit of claim 30, wherein the control circuit includes a lookup table (LUT) correlating sensed integrated circuit temperature to a value of the control signal.

32. The circuit of claim 22, wherein the bit line precharge circuit is further configured, in connection with operation of the memory array to read data from, or write data to, the memory cells, to generate the precharge voltage for application to each bit line with the voltage level that is not greater than the positive supply voltage for the memory cells.

* * * * *